(12) United States Patent
Lee

(10) Patent No.: US 7,087,953 B2
(45) Date of Patent: Aug. 8, 2006

(54) UNIFIED NON-VOLATILE MEMORY DEVICE AND METHOD FOR INTEGRATING NOR AND NAND-TYPE FLASH MEMORY AND EEPROM DEVICE ON A SINGLE SUBSTRATE

(75) Inventor: Peter W. Lee, Saratoga, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 0 days.

(21) Appl. No.: 11/040,862

(22) Filed: Jan. 21, 2005

(65) Prior Publication Data

US 2006/0118854 A1    Jun. 8, 2006

Related U.S. Application Data

(60) Provisional application No. 60/633,276, filed on Dec. 3, 2004.

(51) Int. Cl.
  *H01L 29/788* (2006.01)
(52) U.S. Cl. .................... 257/315; 257/314; 257/316; 257/320; 257/321; 257/322; 257/326
(58) Field of Classification Search ............... None
  See application file for complete search history.

(56) References Cited

U.S. PATENT DOCUMENTS

| | | | |
|---|---|---|---|
| 6,545,310 B1 * | 4/2003 | Li et al. | 257/314 |
| 6,801,458 B1 | 10/2004 | Sakui et al. | 365/185.24 |
| 6,888,190 B1 * | 5/2005 | Yang et al. | 257/314 |

* cited by examiner

*Primary Examiner*—Andy Huynh
(74) *Attorney, Agent, or Firm*—Saile Ackerman LLC; Stephen B. Ackerman

(57) ABSTRACT

A method for making a unified non-volatile memory (NVM) comprised of a NOR-type flash memory, a NAND-type flash memory, and a 3-transistor EEPROM integrated on the same chip is achieved. This unified NVM can be used in advanced smart card applications. The unification is achieved by forming the array of NVM cells and their peripheral high-voltage NMOS-FETs in a deep triple-P well or P-substrate while making high-voltage PMOS-FETs in a deep N well with breakdown voltages greater than +18 V and greater than −18 V, respectively. This novel NVM structure allows one to have compatible breakdown voltages for programming/erasing (charging and discharging) the floating-gate transistors in the NOR flash, the NAND flash, and 3-transistor EEPROM memory.

21 Claims, 24 Drawing Sheets

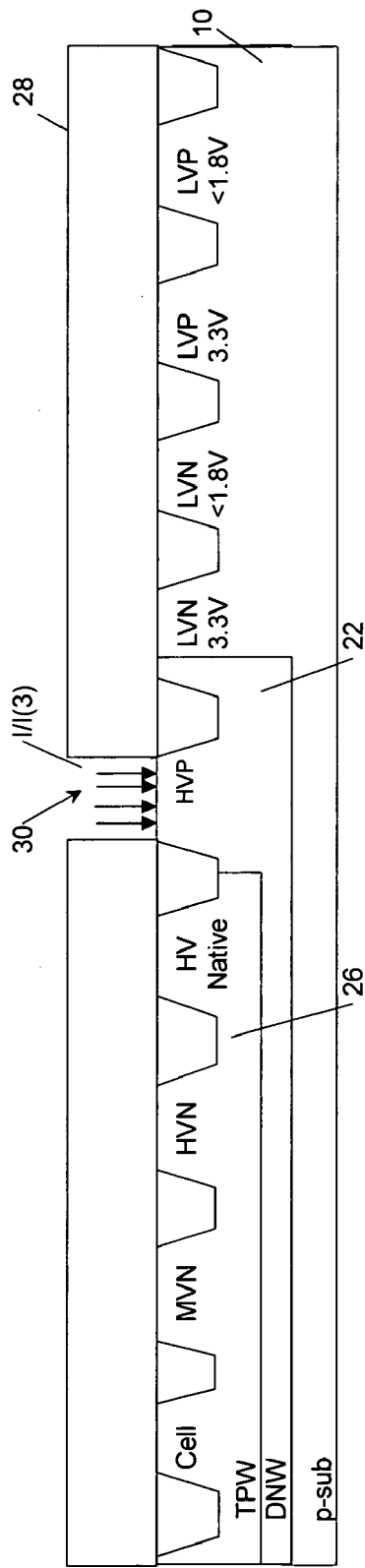
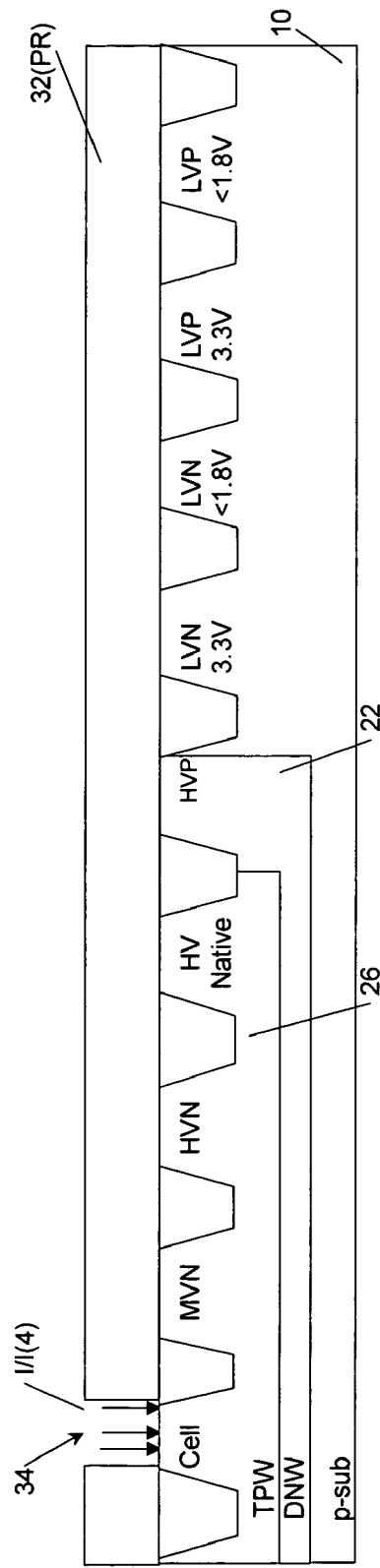
Fig.5
Fig.6

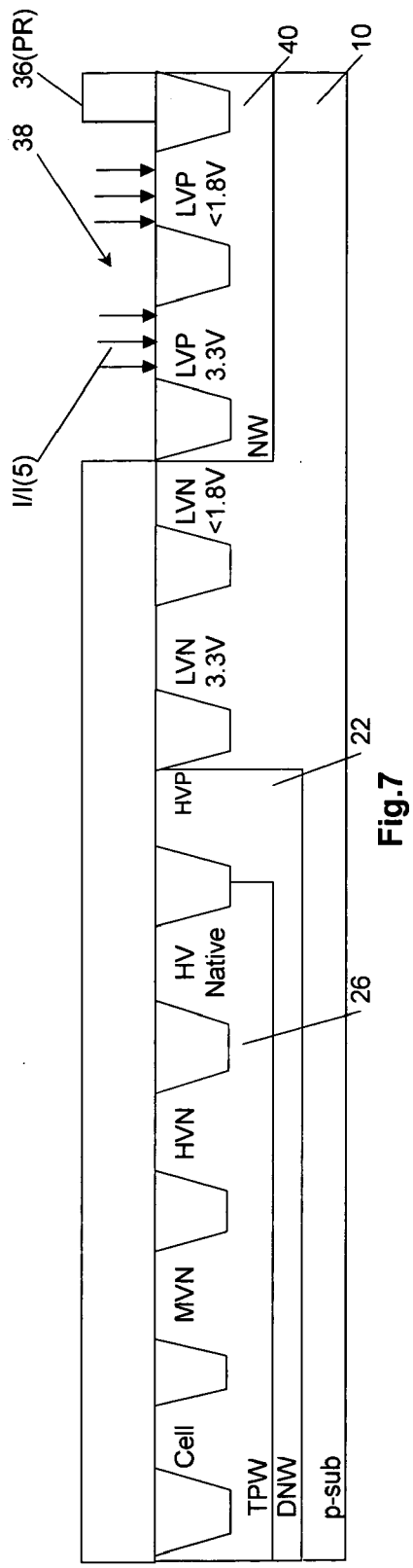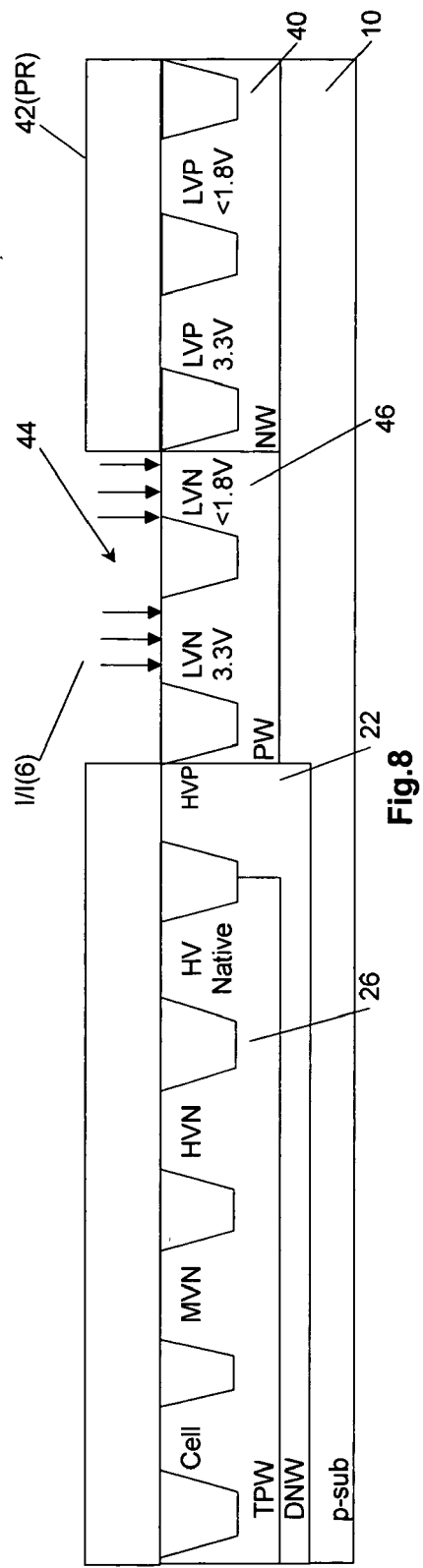

UNIFIED NON-VOLATILE MEMORY DEVICE AND METHOD FOR INTEGRATING NOR AND NAND-TYPE FLASH MEMORY AND EEPROM DEVICE ON A SINGLE SUBSTRATE

This application claims priority to U.S. Provisional Patent Application Ser. No. 60/633,276, filed Dec. 3, 2004 which is herein incorporated by reference.

BACKGROUND OF THE INVENTION (1) Field of the Invention

This invention relates to an improved non-volatile memory (NVM) structure and a method for integrating several memory devices into a single monolithic memory. More particularly this invention relates to forming concurrently an array of devices that includes a NOR-type flash memory device, a NAND-type flash memory device, and a three-transistor EEPROM device on a single substrate with programming/erase voltages that are more compatible over the prior art.

(2) Description of the Prior Art

Non-volatile memory (NVM) flash memory formed from arrays of EEPROM transistors are finding increasing applications in smart cards for recording, storing and transporting digital information. For example, flash memory cards are currently used in digital cameras for recording and storing pictures that can be later displayed on personal computers (PCs), TVs or printed. Flash memories in smart cards are being used not only for storing data but also for storing application programs and the like. These smart cards are finding increasing use in applications such as fingerprint identification, identification cards, health records, transportation programs and many more applications which include encryption for personal security, and also applications such as e-passport, credit card, JAVA card subscriber identity module (SIM).

Basically the non-volatile memory in these smart cards consists of Electrically Erasable Programmable Read Only Memory (EEPROM) transistors configured into an array of EEPROMs to form NOR and NAND flash memory which can be programmed and erased to store data (information) and application programs and the like, and are accessed through peripheral circuits that are also integrated onto the same semiconductor chip.

These EEPROMs are similar to conventional field effect transistors (FETs) but with an additional floating gate (FG). The FG is formed on a thin gate oxide between the control gate (CG) and the FET channel which is between the FET source and drain areas on a semiconductor substrate. The floating gate (FG) is electrically isolated and can be charged by generating an electric field by applying an electric potential between the control gate (CG) and substrate. Electrons are injected either by hot electron injection (HEI) or by Fowler-Nordheim (FN) tunneling through the thin gate oxide to charge or discharge the FG. This charged state remains on the FG after the power source is removed because the FG is electrically isolated (insulated) which results in non-volatile memory (NVM).

By using appropriate sensing circuits one can determine whether the EEPROM floating gate (FG) is charged or not. By sensing the state of the EEPROM one can utilize the charge state to represent binary 0 and 1. Arrays of EEPROMs can be used to store application programs and large amounts of data in binary form for information purposes, and can include other circuits that carry out Boolean algebra (logic).

In today's NVM technologies the two most commonly used memory circuits are the NOR-type flash memory and the NAND-type flash memory. In the NOR-type memory the individual EEPROM transistors are connected in parallel. FIG. 31 shows a schematic of a portion of a NOR circuit. In FIG. 31 the EEPROM transistors Tx1, Tx2, and Tx3 are connected in parallel between a bit line (FET drain) and a sense line (FET source). Arrays of NOR memory cells are faster for read/write (program/erase) than the conventional NAND memory cells. NOR cells require higher power but are much larger and require greater area per unit memory cell on the substrate. Arrays of NOR cells (NOR-flash memory) are preferred for programming applications, but are not desirable for mass storage of data.

In the NAND-type memory the individual floating-gate transistors are connected in series. One arrangement is shown in the schematic in FIG. 30 for a 16-bit series of NAND cells. As shown in FIG. 30 the floating-gate transistors (cells) are connected in series with conventional (single-gate) FETs SG1 and SG2 for selecting (accessing) the series of NAND memory cells for programming or erasing data. A bit line (BL) and word lines (WL) 1–16 are also shown for a portion of a NAND memory array. This array of NAND memory cells has slower read times than the NOR-type memory, but the NAND circuit consumes much less power and has much higher cell density than the NOR-type memory. Therefore NAND memory is preferred for mass storage of data, in which the data requires frequent updates. Likewise NOR memory is more desirable for storing CPU and application programs and the like, since programs require infrequent updating. Also the program/erase (P/E) cycle for the NOR circuit is shorter than the P/E cycle for the NAND.

Another memory device that is desirable on the smart card is a 3-transistor EEPROM cell array used for storing a few bytes of information that is changed frequently. A single 3-transistor EEPROM cell is shown in FIG. 31. The 3-transistor EEPROM cell consists of a floating-gate transistor between and in series with two select transistors labeled STX1 and STX2. Arrays of these 3-transistor EEPROM cells are desirable for storing small groups of bytes of information that are frequently updated.

As applications of the smart cards become more diverse, it is highly desirable to integrate all three memory types on a single P-substrate (chip) for superior erase and program operation in units of bytes and pages as opposed to Toshiba's approach.

Numerous methods for making programmable nonvolatile memory have been reported in the literature. For example, one method for making non-volatile semiconductor memory is described in U.S. Pat. No. 6,801,458 B2 to Sakui et al. in which 3-transistor memory cell arrays are merged with NAND-type memory. Each 3-transistor cell is an EEPROM transistor sandwiched between two select transistors. However, Sakui does not merge a NOR-type memory with a NAND-type memory because Sakui cannot generate a negative high voltage such as −18 V on a triple-well process which allows the erase and program functions more efficiently performed in units of bytes and pages for the NOR-type circuits as well as NAND-type Flash and 3-T or 4-T EEPROM without a big waste in well spacing of three-cell arrays.

However, there is no prior art that appears to satisfy the requirement for making compatible NOR, NAND and 3-transistor EEPROMs on the same chip. Therefore, there is still a strong need in the semiconductor industry for making flash memory for a smart card, embedded flash and many others using a single compatible (unified) semiconductor process for making NOR, NAND and 3-transistor EEPROMs on the same chip.

SUMMARY OF THE INVENTION

A principal object of this invention is to integrate NOR-type flash memory, NAND-type flash memory, and 3-transistor or N-transistor EEPROMs on a single semiconductor chip (substrate) to form one monolithic system using a compatible unified (single) process.

A second object of this invention is to form a NOR, NAND, and 3-transistor or N-transistor EEPROM device and their associated peripheral transistors in a triple-P implanted single well.

A third object of this invention is to use a single program voltage (+18 V) and a single erase voltage (−18V) to program and erase the floating gates on the EEPROM devices and −18 V to erase NOR-type Flash devices.

A fourth object of this invention is to form the high-voltage peripheral circuits with N-channel FETs in triple-P well areas to generate negative high voltages of between about −18 V and −21 V.

A fifth object of this invention is to use this unified NVM flash memory for advanced smart card and embedded flash applications that require both NOR and NAND memory on the same card, such as SIM, identification cards, health cards, and the like.

In accordance with the objects of the present invention, a method for fabricating a novel non-volatile memory system is described. The method of making this structure begins by providing a semiconductor P-substrate. Shallow trenches are etched in the substrate and filled with an insulator to electrically isolate active device areas on the substrate. Deep N wells are formed in the high-voltage device and memory cell areas, and a key feature is to form triple-P doped wells within the deep N wells for forming an array of floating-gate cells for making the NOR-type flash memory, NAND-type flash memory, and 3-transistor EEPROMs. Another key feature of the invention is to form NMOS in the triple-P doped wells with high breakdown voltages, and to form PMOS FETs with high breakdown voltages and in the deep N doped wells, respectively. After a series of ion implantations for forming threshold voltages for high-voltage and cell devices and ion implants for forming P and N wells for low-voltage peripheral devices, a thin floating gate oxide is formed on the substrate over the memory cell areas in the triple-P doped or P-substrate regions. A first polysilicon layer is deposited and patterned over the thin floating gate oxide to be patterned later to form an array of floating gates for all three floating-gate devices. Then a silicon oxide/silicon nitride/silicon oxide (ONO) layer is formed on the first polysilicon layer (floating gates) to form the control gate oxide. A photoresist implant block-out mask and an ion implant are used to adjust the threshold voltage for the high-voltage N-channel FETs in the triple-P doped wells. A thick gate oxide is formed for the high-voltage devices in the triple-P doped wells in the deep N wells, and a patterned photoresist etch mask is used to remove the thick gate oxide from the surface of the substrate over the low-voltage devices. A second thinner gate oxide is formed for the low-voltage FETs having a threshold voltage for Vdd of 3.3 V devices. Then another patterned photoresist etch mask is used to remove the second thinner gate oxide from the surface of the substrate where low-voltage FET devices having a threshold voltage for Vdd of 1.8 V or lower devices are to be formed. After removing the photoresist, an even thinner third gate oxide is formed for the 1.3 V FETs. A second polysilicon layer is deposited and patterned to provide for the control gates for the EEPROMs while providing a control gate for the conventional (single-gate) high-voltage FETs (+/−18–20 V) and lower-voltage FETs (+/−1.8 V or lower and +/−3.3 V). A photoresist etch mask is used to pattern the second polysilicon layer, the ONO, the first polysilicon layer over the triple-P doped wells or P-substrate to form the floating-gate electrodes having the floating gate and the control gate for the NOR, NAND, and 3-transistor EEPROM memory. Then a series of photoresist implant block-out masks are used to form the lightly doped drains over the low-voltage (1.8 V or lower) FETs. Then a second series of photoresist implant block-out masks and ion implants (P doped and N doped) are used to form the source/drain (S/D) contacts over the high-voltage (18 V) FETs in the triple-P doped areas, and for the 3.3 V FETs for the NMOS and PMOS FETs. Next a block-out mask with openings self-aligned over the source area of the floating-gate transistors and the adjacent shallow trench is used to etch the oxide in the shallow trench and a source implant is carried out to improve the electron tunneling in the thin gate oxide. A patterned photoresist mask and an ion implant are used to form the S/D areas for the floating-gate FET (memory) cells.

Two more patterned photoresist masking steps and two ion implants are used to form the N+ S/D contacts and the P+ S/D contacts, respectively, for the high-voltage and low-voltage conventional NMOS and PMOS FETs. Then a metal is deposited selectively, using a photoresist mask, on some of the low-voltage FET polysilicon gate electrodes and on the S/D contacts on the substrate. After removing the photoresist the substrate is annealed to form a metal silicide. This reduces the polysilicon resistance, which is desirable for some devices. A first insulating layer, such as a PSG or BPSG, is deposited. Via holes are etched in the insulating glass layer and a metal layer is deposited and polished back to form metal plugs in the via openings. Then a metal layer, such as Al or Cu, is deposited and patterned to complete the flash memory structure having compatible NOR, NAND, and 3-transistor EEPROM cells up to the first level of metal interconnections.

BRIEF DESCRIPTION OF THE DRAWINGS

FIGS. 1 through 28 show schematic cross-sectional views of the non-volatile memory (NVM) structure for the sequence of process steps for making this unified NOR-type flash memory, NAND-type flash memory, and 3-transistor EEPROM memory and integrated with high voltage (HV) and low voltage (LV) conventional single-gate FETs for peripheral circuits.

DESCRIPTION OF THE PREFERRED EMBODIMENT

Figure 1:
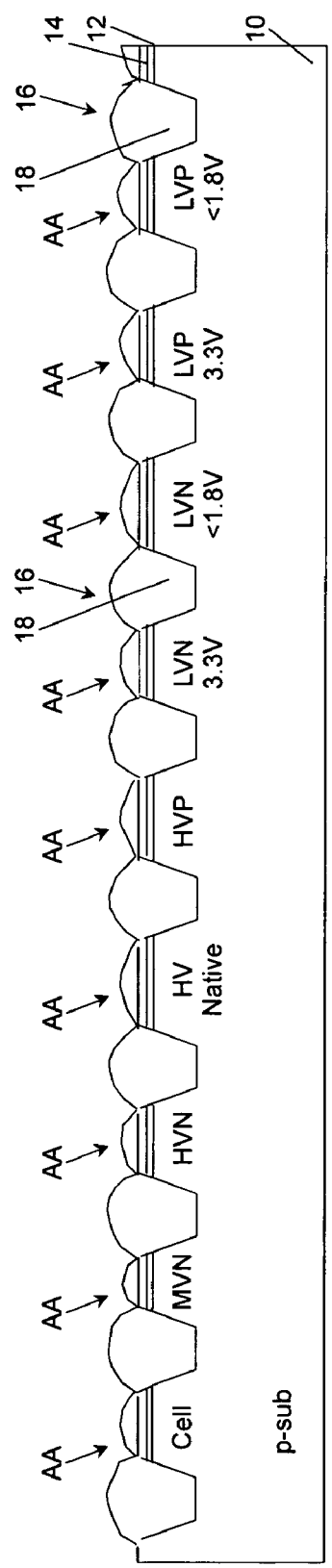

The method for making this unified NOR-NAND-EEPROM structure in a triple-doped P well or a P-substrate is now described in detail. Although the method is described for making a large array of NVM cells, only one cell area for the floating-gate device is depicted in the figures (left side) to simplify the drawings and to allow space in the drawings for depicting the integration of the other peripheral single-gate FETs with the NVM cells. Although the process is shown pictorially for integrating a NOR, a NAND, and a 3-transistor EEPROM device on the same substrate (chip) having compatible program/erase voltage, it should be understood by one skilled in the art that the unified structure can be used to make a variety of novel smart cards depending on the circuit layout (mask set).

Starting with the cross section in FIG. 1, the process begins by providing a semiconductor substrate 10, labeled P-sub. A typical substrate is a single-crystal silicon, doped with boron to a concentration of between about 5.0 E 14 and 9.0 E 14 atoms/cm$^3$ and having a resistivity of about 15–25 ohm-cm. A pad oxide layer 12 is grown by thermal oxidation to form a silicon oxide layer to a thickness of between about 100 and 300 Angstroms. Next a silicon nitride ($Si_3N_4$) layer 14 is formed, for example by CVD using $SiH_4$ and ammonia as the reactant gas mixture. Layer 14 is formed to a thickness of between about 1000 and 1500 Angstroms. The pad oxide/silicon nitride layers (12,14) are patterned using a photoresist mask (not shown) and plasma etching to leave portions of layers 12,14 over and protecting the Active Areas (AA) (device areas) where semiconductor devices will be made. The first mask level also includes alignment marks for aligning subsequent masking levels. Next, using the photoresist and pad oxide 12 as an etch mask, shallow trenches 16 are etched in the substrate 10 to a depth of between 3000 and 4500 Angstroms to electrically isolate the device areas AA. Typically the trenches 16 are etched using anisotropic plasma etching and an etchant gas containing fluorine and/or chlorine, such as $CCl_2F_2$. The photoresist (not shown) is then removed, for example, by ashing in oxygen. The trenches 16 are further cleaned and conditioned to improve the Si edges of the trenches to minimize electrical leakage current in the FET channel when the FETs are powered up. A CVD $SiO_2$ 18 is then deposited to fill the trenches 16. Typically the silicon oxide 18 can be formed using high-density plasma (HDP) deposition.

Figure 2:
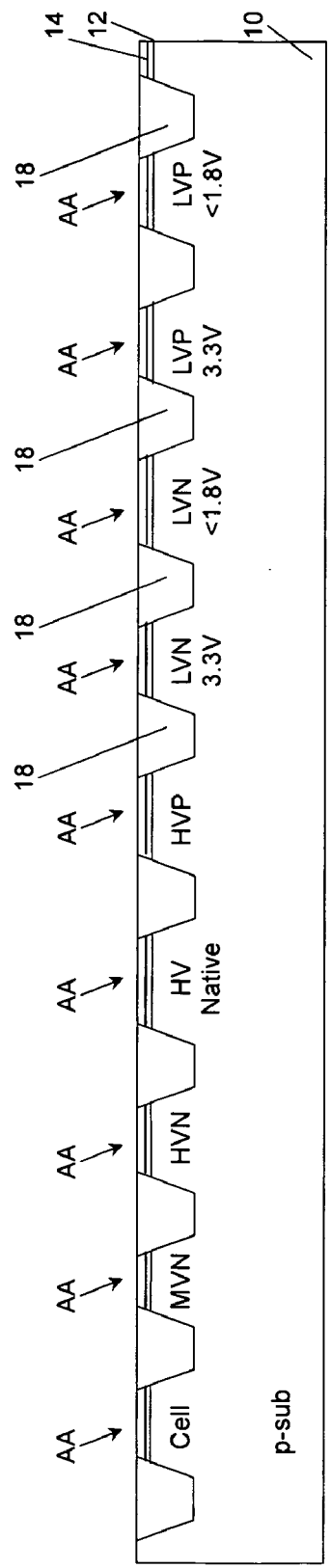

Referring to FIG. 2, the CVD oxide 18 is chemically-mechanically polished (CMP) back to the $Si_3N_4$ surface 14 to form the shallow trench isolation (STI) 18 in the trenches 16 resulting in a surface that is planar with the AA. Then the $Si_3N_4$ layer 14 is removed, such as by wet-etch stripping in a hot phosphoric acid solution. The $SiO_2$ pad oxide is retained to protect the silicon surface of the substrate 10 during subsequent implants.

Figure 3:
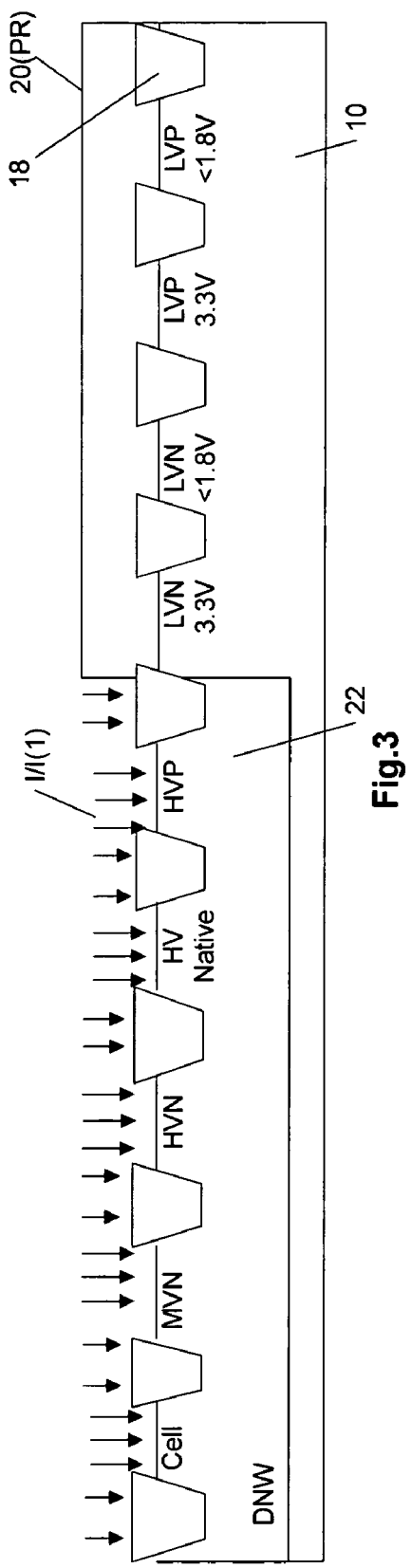

Referring to FIG. 3, a photoresist layer 20 is deposited and patterned to form an ion-implant (I/I) block-out mask for implanting deep N wells in the substrate in the areas where the NOR, NAND, EEPROM and high-voltage peripheral circuits will be formed for option one process. For option two a photoresist layer 20 is deposited and patterned to form an ion-implant (I/I) block-out mask for implanting deep N wells in the substrate in the areas where high-voltage peripheral circuits only will be formed. As shown in the left side of FIG. 3, deep N wells 22 are formed by ion implantation, depicted by vertical arrows and labeled I/I(1). Preferably the ion implantation is carried out using phosphorus ($P^{31}$) to achieve a final concentration of between about 5.0 E 15 and 1.0 E 16 atoms/cm$^3$, and implanted to a depth of between about 25,000 and 35,000 Angstroms after final annealing. The block-out photoresist mask 20 is then removed, for example by oxygen ashing, followed by any necessary cleaning of the substrate.

Figure 4:
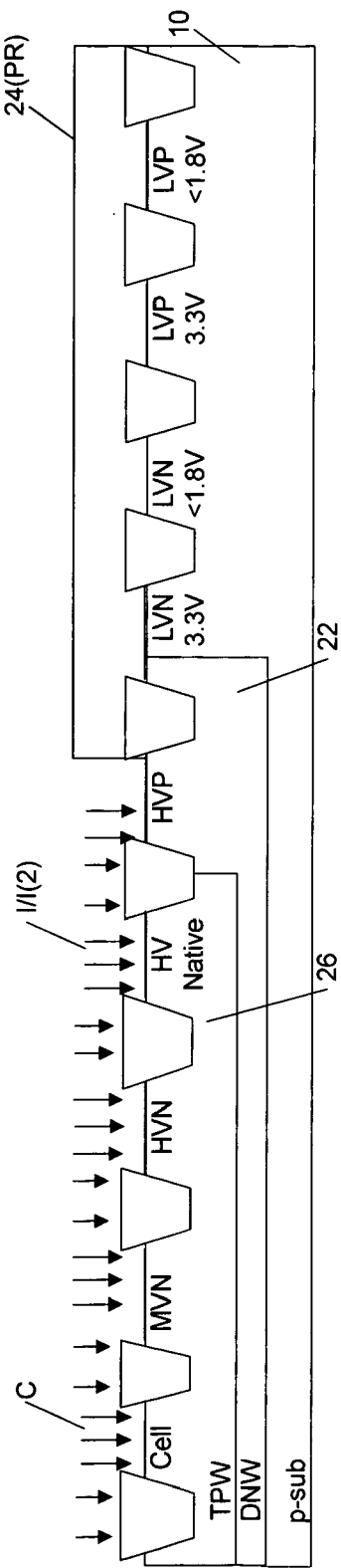

Referring to FIG. 4 and based on option one, and a key feature of this invention is to form triple-P wells using P-type implants within the deep N wells 22 for the NOR, the NAND, 3-transistor EEPROM memory, and for the high-voltage NMOS peripheral devices. Only one floating-gate cell, labeled C, is depicted for these arrays of NORs, NANDs, and 3-transistor EEPROMs to leave room in the figures for the peripheral devices.

Continuing with FIG. 4, a new photoresist layer 24 is deposited and patterned to form a block-out mask for implanting the triple P wells in the substrate within the deep N wells areas 22 where the NOR, NAND, 3-transistor EEPROM memory and high-voltage peripheral circuits will be formed for N-channel FETs. As shown in the left side of FIG. 4, triple P wells 26 are formed by ion implantation, depicted by vertical arrows and labeled I/I(2). Preferably the ion implantation is carried out using boron ($B^{11}$) to achieve a final concentration of between about 1.0 E 16 and 2.0 E 16 atoms/cm$^3$, and doped to a depth of between about 10,000 and 20,000 Angstroms after final annealing. The photoresist block-out mask 24 is removed, for example by oxygen ashing, and the substrate is cleaned.

Referring to FIG. 5, a photoresist mask 28 is deposited with openings 30 over the deep N well areas 22 where high-voltage PMOS(P-channel FETs) are required. Then an implant, labeled I/I(3), is carried out to adjust the threshold voltage for the high-voltage PMOS FET transistors. The implant dopant is preferably arsenic to have a concentration of between about 1.0 E 16 and 2.0 E 16 atoms/cm$^3$ to a depth of about 100 to 300 Angstroms to provide a threshold voltage (Vt) of between about −0.7 and −1.2 volts. The photoresist 28 is then removed.

Referring to FIG. 6, a photoresist mask 32 is patterned to have openings 34 over the memory cell areas where Flash cell will be formed. An ion implant labeled I/I(4) is used to adjust the Vt for the memory cells. The implant is preferably boron ($B^{11}$) and has a final concentration of between about 2.0 E 16 and 4.0 E 16 atoms/cm$^3$ to a depth of about 200 to 400 Angstroms to provide a threshold voltage (Vt) of between about 1.5 and 2.5 volts. The photoresist 32 is then removed.

Continuing with the process and referring to FIG. 7, a photoresist mask 36 is patterned to form openings 38 for implanting. A N type dopant, such as $As^{75}$, is ion implanted, labeled I/I(5), to form N wells 40 for the low threshold voltage, for example 1.8 and 3.3 volt FETs, peripheral devices for P-channel FETs. The N wells 40 are doped to have a final concentration of between about 2.0 E 16 and 4.0 E 16 atoms/cm$^3$ to a depth of about 8000 to 15,000 Angstroms. The photoresist 36 is then removed.

Referring to FIG. 8, a photoresist mask 42 is patterned to form openings 44 for implanting. A P type dopant, such as boron, is ion implanted, labeled I/I(6), to form P wells 46 for the low-voltage peripheral devices for N-channel FETs. The P wells 46 are doped to have a final concentration of between about 1.5 E 16 and 3.5 E 16 atoms/cm$^3$ to a depth of about 8000 to 15,000 Angstroms. The photoresist 42 is then removed.

Figure 9:
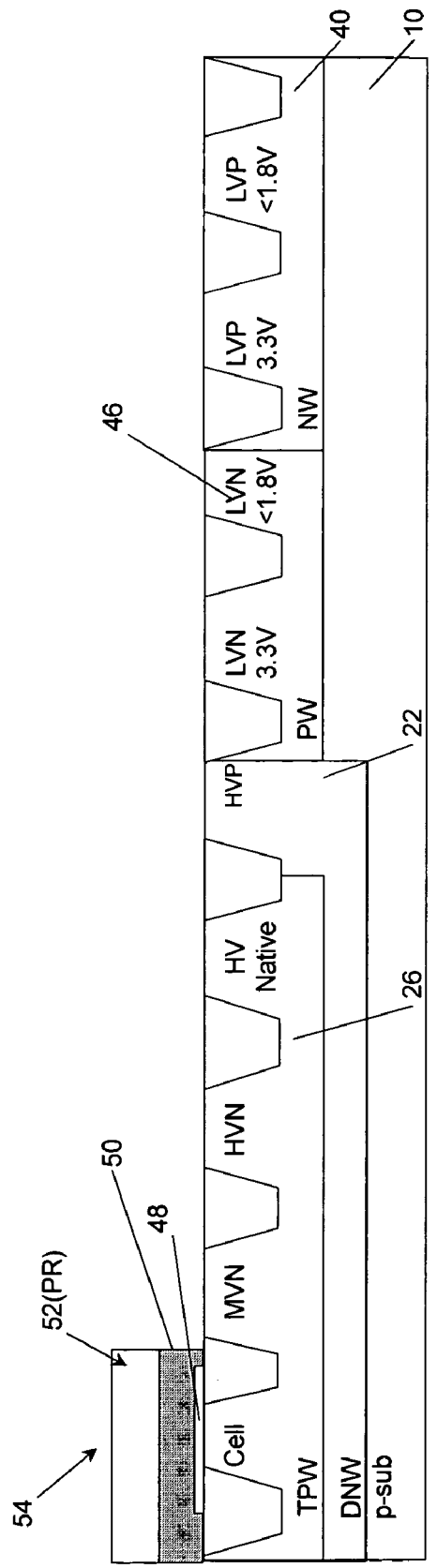

Referring to FIG. 9, the pad oxide 12, which was used to protect the substrate surface 10 during the ion implants, is removed. The oxide 12 is removed, for example, using a dilute solution of hydrofluoric (HF) acid and water. Next, the surface of the silicon substrate is thermally oxidized to form a thin floating gate oxide 48 to a thickness of between about 80 and 90 Angstroms. A first polysilicon layer 50 is deposited, for example by CVD using a reactant gas such as SiH$_4$, SiCl$_2$H$_2$, or the like. The first polysilicon layer 50 is formed to a thickness of between about 1,200 and 2,000 Angstroms, and is preferably undoped.

Still referring to FIG. 9, a photoresist mask 52 and anisotropic plasma etching are used to pattern first polysilicon layer 50 to leave portions over the cell areas 54 while etching off the polysilicon layer 50 over the peripheral device areas. The first polysilicon layer 50 is also used for the bottom plate (electrode) for a PIP capacitor (not shown). The photoresist 52 is removed.

Figure 10:
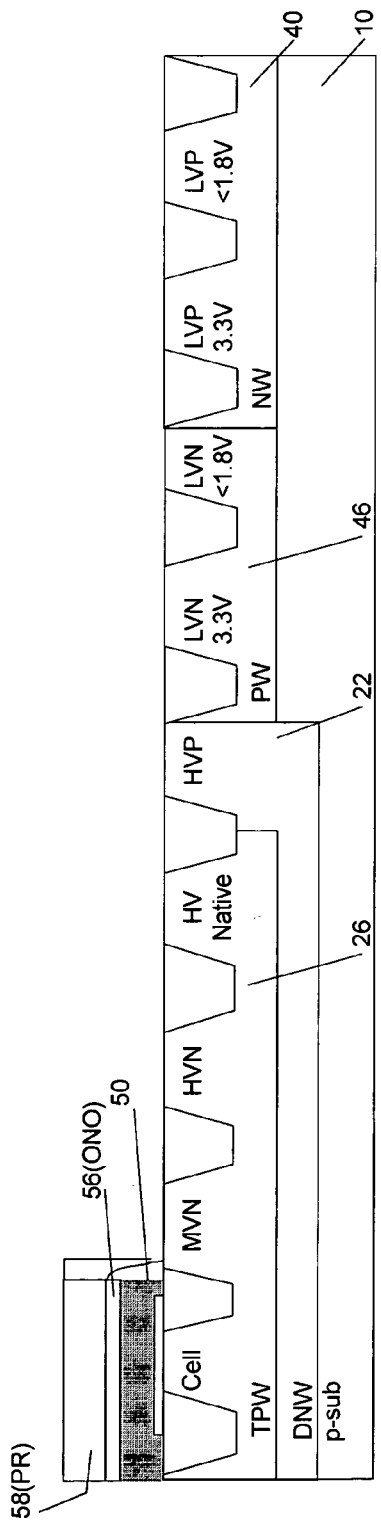

Referring to FIG. 10, a control gate oxide 56 is formed on the first polysilicon layer 50. The control gate oxide 56 is preferably a multilayer of SiO$_2$/Si$_3$N$_4$/SiO$_2$ (ONO) and is formed by high-temperature oxidation of the first polysilicon layer 50, followed by deposition of Si$_3$N$_4$, and then the reduction of the Si$_3$N$_4$ by thermal oxidation to form the upper SiO$_2$ layer. The thickness of the ONO layer 56 depends on the electrical requirements of the circuit, but would preferably be between about 35 and 50 Angstroms for the lower SiO$_2$, between about 100 and 200 Angstroms for the Si$_3$N$_4$, and between about 35 and 50 for the upper SiO$_2$. A patterned photoresist mask 58 is used to retain the ONO layer 56 on the first polysilicon layer 50 over the cell areas 54 while removing the ONO elsewhere on the substrate. The photoresist mask 58 is removed.

Figure 11:
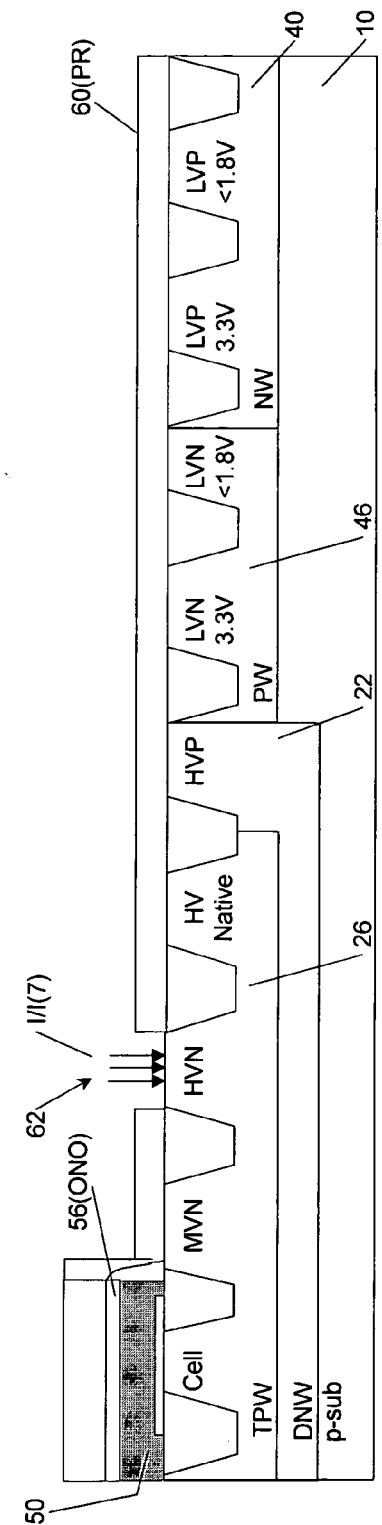

Referring to FIG. 11, a photoresist mask 60 is deposited with openings 62 over the triple P well areas 26 where high-voltage NMOS(N-channel FETs) are required. Then an implant, labeled I/I(7), is carried out to adjust the threshold voltage for the high-voltage NMOS FET transistors. The implant dopant is preferably boron to have a concentration of between about 1.0 E 16 and 2.0 E 16 atoms/cm$^3$ to a depth of about 200 to 500 Angstroms to provide a threshold voltage (Vt) of between about 0.7 and 1.2 volts. The photoresist 60 is then removed.

Figure 12:
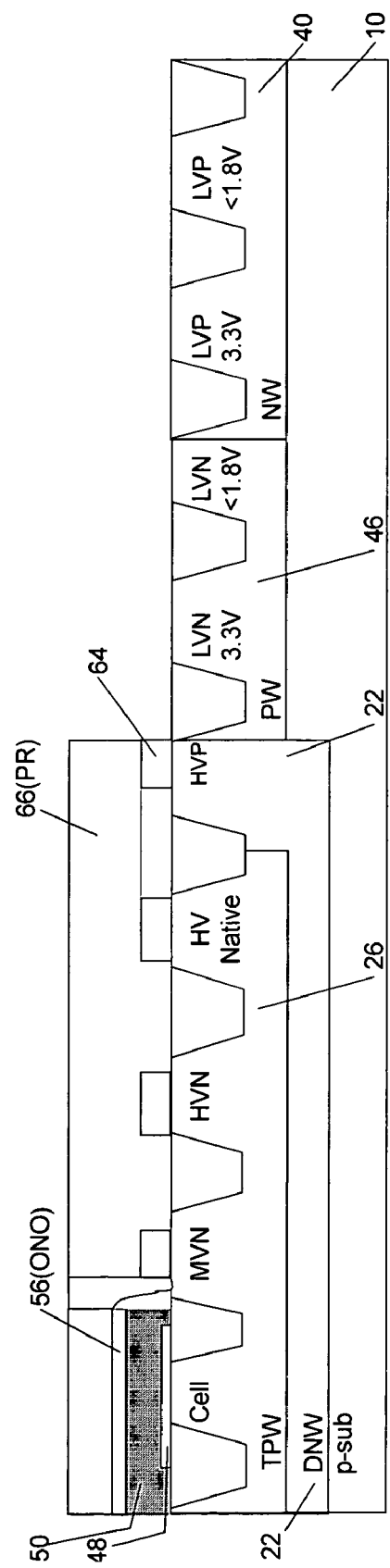

Referring to FIG. 12, after appropriate cleaning of the substrate surface, a relatively thick SiO$_2$ layer 64 is formed on the surface of the substrate for forming the gate oxide for the high-voltage transistors for the peripheral devices. For example, the oxide 64 can be formed by thermal wet oxidation to a thickness of between about 300 and 420 Angstroms. A photoresist layer 66 is used to protect the oxide 64 over the high-voltage NMOS and PMOS formed in the deep N wells 22 and in the triple P wells 26 while removing the oxide 64 elsewhere on the substrate. The photoresist 66 is removed.

Figure 13:
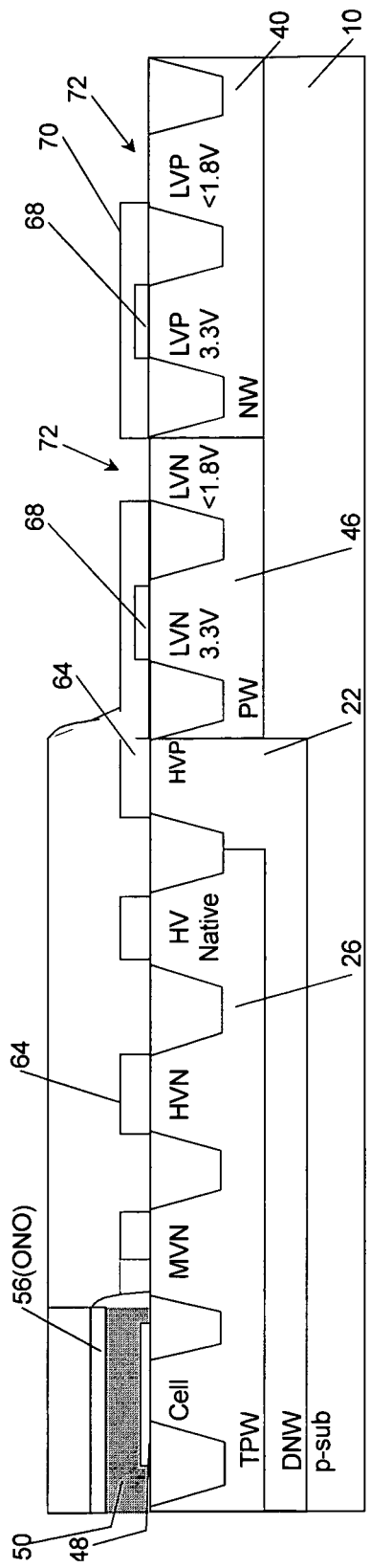
Figure 14:
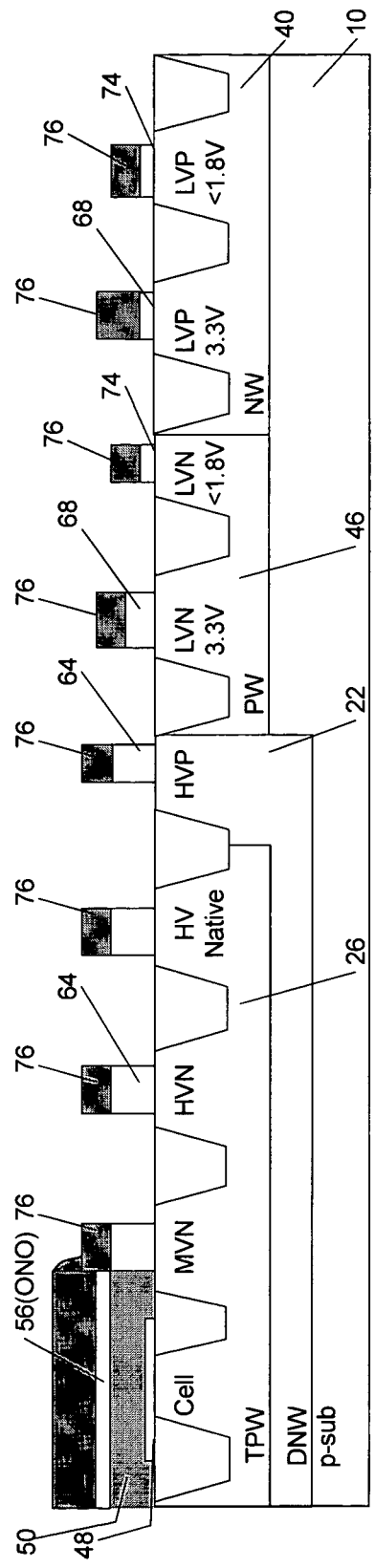

Referring to FIG. 13, a relatively thin gate oxide 68 is formed for the 3.3 V threshold voltage in the regions for the P- and N-channel transistors, labeled LVN and LVP on the substrate. The gate oxide 68 is formed by thermal oxidation to a thickness of between about 60 and 80 Angstroms. A patterned photoresist mask 70 is deposited with openings 72 over the device areas labeled LVN 1.8 V (or lower) and LVP 1.8 V (or lower) and gate oxide 68 is removed by etching. The photoresist mask 70 is then removed, and a thinner gate oxide 74 is grown on the device areas labeled LVN 1.8 V and LVP 1.8 V, as shown in FIG. 14. The gate oxide 74 is preferably grown to a thickness of between 10 and 40 Angstroms.

Still referring to FIG. 14, a second polysilicon layer 76 is deposited, for example by CVD using a reactant gas such as SiH$_4$, SiCl$_2$H$_2$, or the like. Second polysilicon layer 76 is formed to a preferred thickness of between about 1800 and 3000 Angstroms, and is doped with phosphorous to improve electrical conductivity. This second polysilicon layer 76 is also used to make the top plate for the polysilicon/insulator/polysilicon (PIP) capacitor (not shown). A patterned photoresist mask (not shown) is used to pattern polysilicon gate electrodes 76 over the thick gate oxides 64 and the thinner gate oxides 68 and 74.

Figure 15:
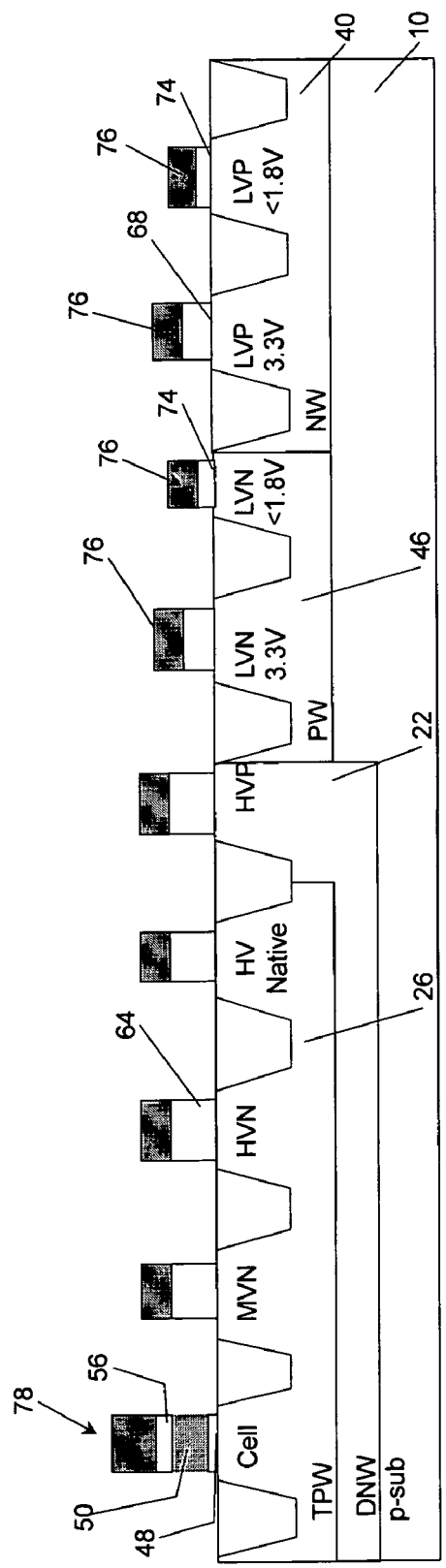

Referring to FIG. 15, a photoresist mask (not shown) and anisotropic plasma etching are used to etch the second polysilicon layer 76, control gate oxide 56 and the first polysilicon layer 50 to form the control gate electrodes and floating gates for floating-gate transistors in the memory cell areas. Although only one memory cell (floating-gate transistor) is shown in the drawing because of space, it should be understood that arrays of large numbers of these cells are formed for both NOR, NAND, and EEPROM memory.

Figure 16:
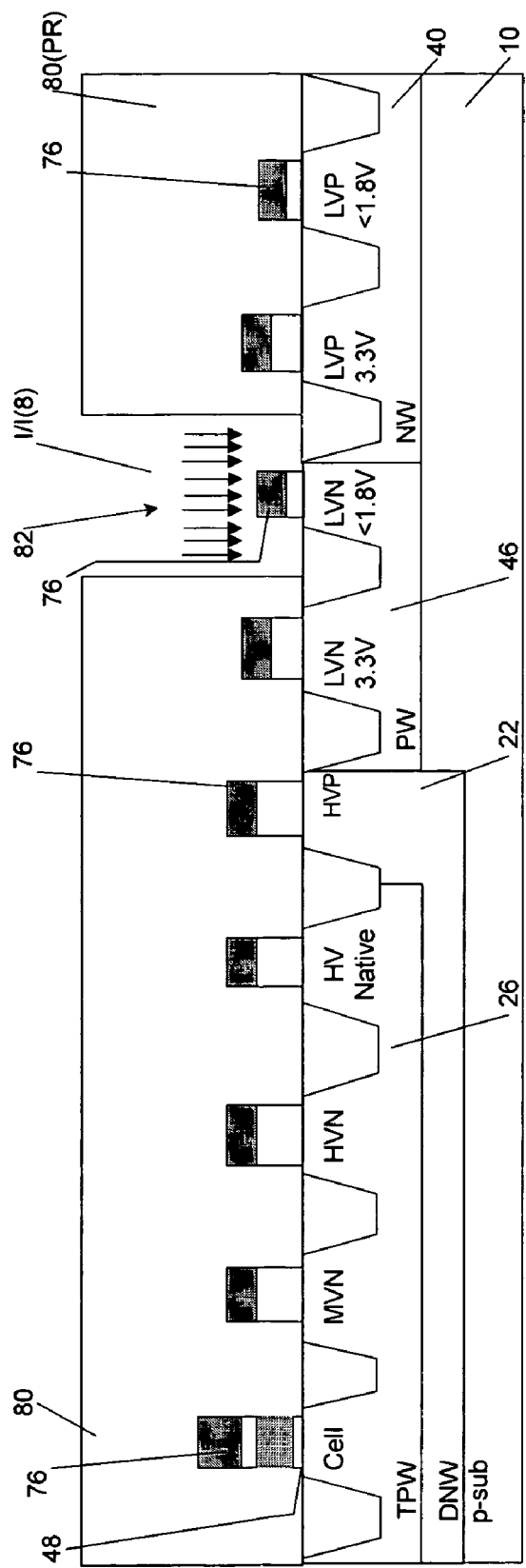

Continuing and referring to FIG. 16, a photoresist block-out mask 80 with openings 82 over the low-voltage NMOS (N-channel FETs), labeled LVN 1.8 V, is used to implant the lightly doped drains (LDD) as depicted by I/I(8). The implanted dopant is As$^{75}$ and the LDDs are preferably doped to a concentration of between about 3.0 E 18 and 6.0 E 18 atoms/cm$^3$. The photoresist 80 is then removed, for example by ashing in oxygen.

Figure 17:
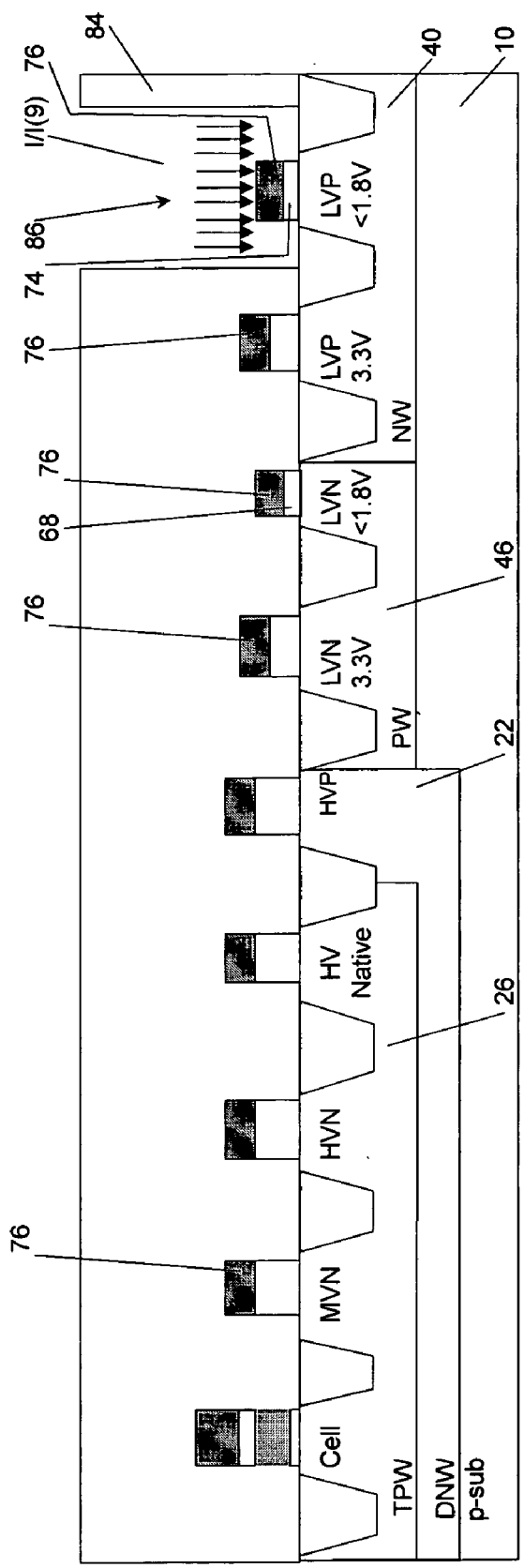

Referring to FIG. 17, a photoresist block-out mask 84 with openings 86 over the low-voltage PMOS(P-channel FETs), labeled LVP 1.8 V, is used to implant the lightly doped drains (LDD), as depicted by I/I(9). The implanted dopant is B$^{11}$ and the LDDs are preferably doped to a concentration of between about 3.0 E 18 and 6.0 E 18 atoms/cm$^3$. The photoresist 84 is then removed.

Figure 18:
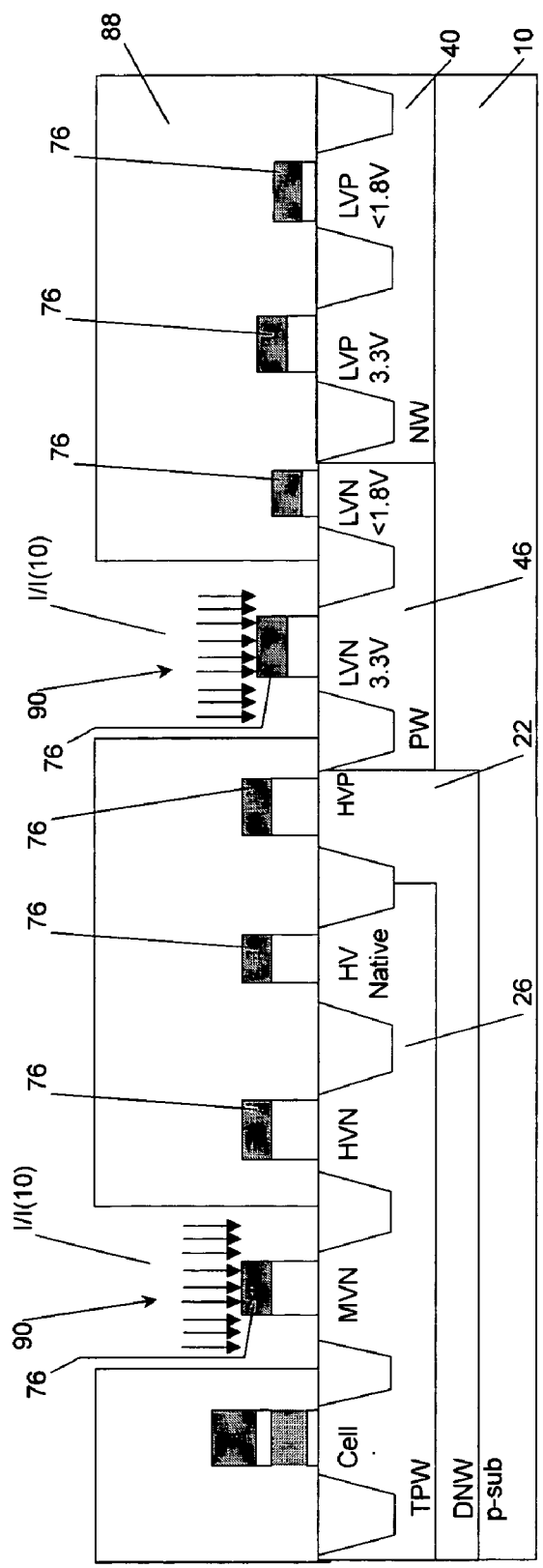

Referring to FIG. 18, a photoresist block-out mask 88, with openings 90 over the low-voltage NMOS(N-channel FETs), labeled LVN 3.3 V, and with openings 90 over the MVN in the triple-P doped region, is used to implant the lightly doped drains (LDD) as depicted by I/I(10). The implanted dopant is As$^{75}$ to a preferred concentration of between about 2.0 E 18 and 5.0 E 18 atoms/cm$^3$. The photoresist 88 is then removed, for example by ashing in oxygen.

Figure 19:
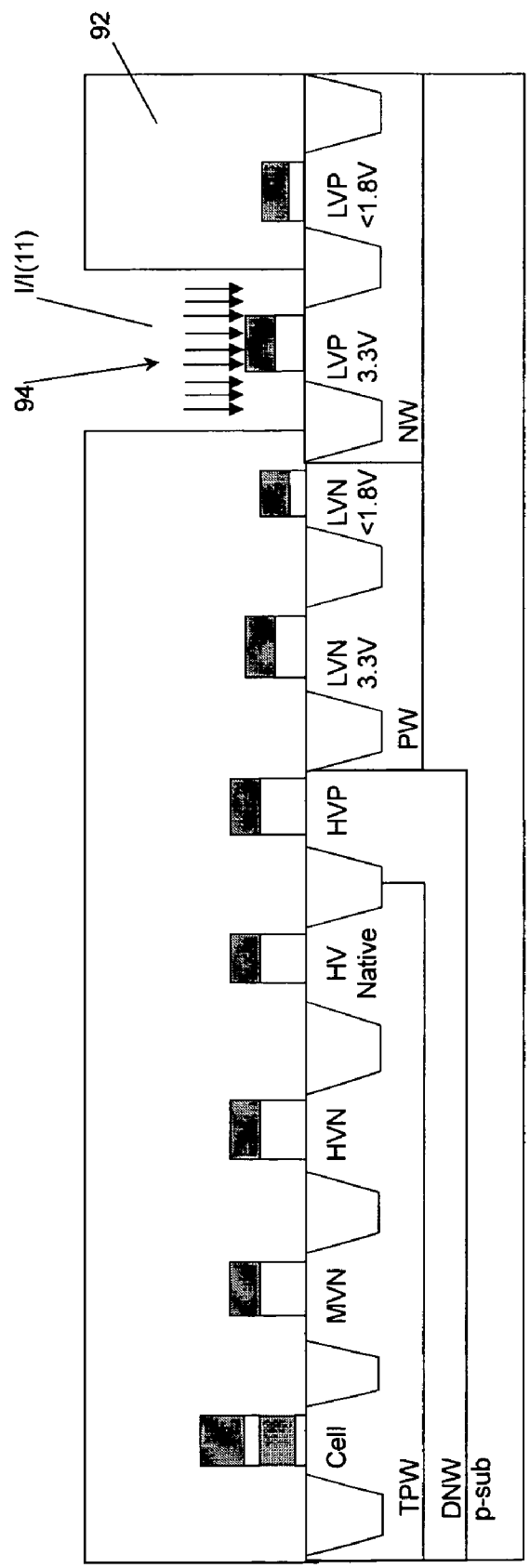

Referring to FIG. 19, a photoresist block-out mask 92 with openings 94 over the low-voltage PMOS(P-channel FETs), labeled LVP 3.3 V, is used to implant the lightly doped drains (LDD) as depicted by I/I(11). The implanted dopant is B$^{11}$ and preferably doped to a concentration of between about 2.0 E 18 and 5.0 E 18 atoms/cm$^3$. The photoresist 92 is then removed. Sidewall spacers (not shown) are formed on the polysilicon gate electrodes after forming the lightly doped implants and before the silicide is formed on the gate electrodes and the source/drain regions.

Figure 20:
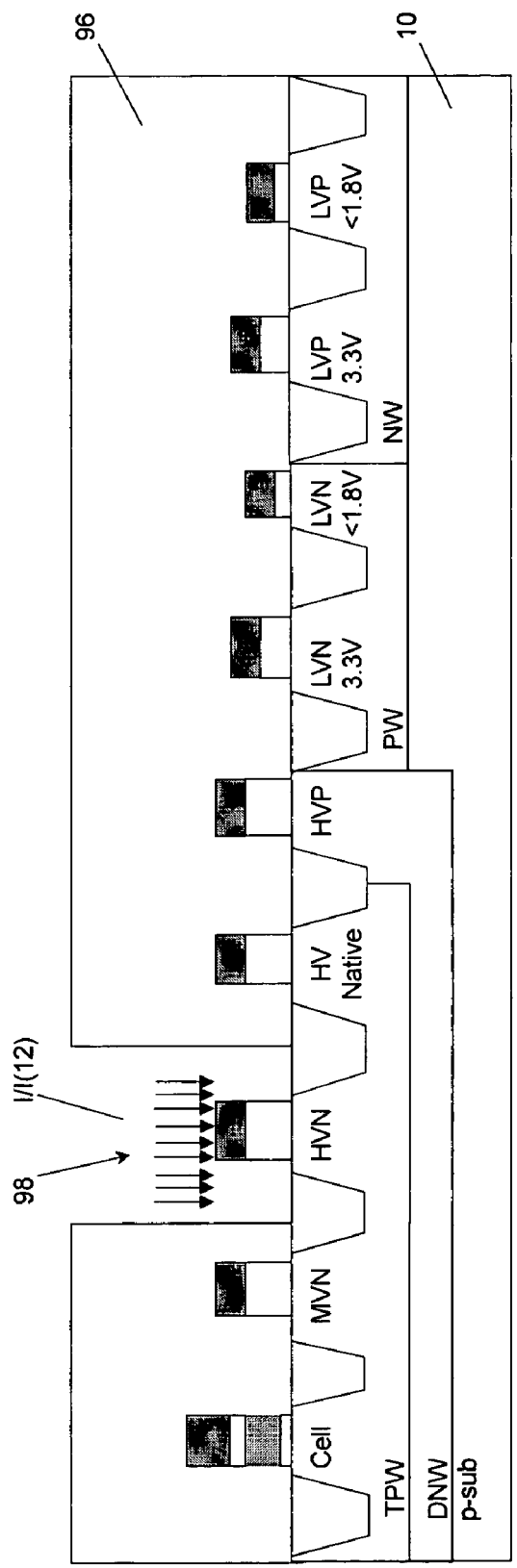

Referring to FIG. 20, a photoresist block-out mask 96 with openings 98 over the high-voltage NMOS(N-channel FETs), labeled HVN, is used to implant the source/drain (S/D) contacts as depicted by I/I(12). The implanted dopant is P$^{31}$ and the substrate is doped to a concentration of between about 0.8 E 19 and 1.5 E 19 atoms/cm$^3$. This high-voltage S/D implant is formed using a double-diffused implant to form lighter and deeper implants than the S/Ds implants I/I(11). The photoresist 96 is then removed, for example by ashing.

Figure 21:
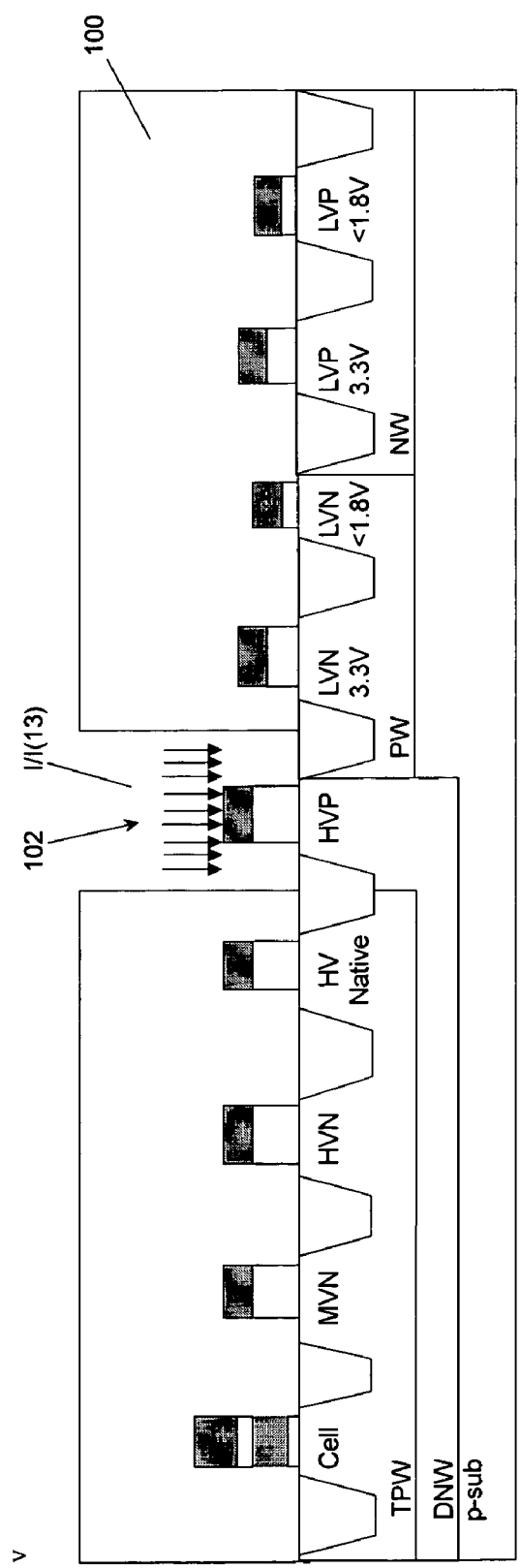

Referring to FIG. 21, a photoresist block-out mask 100 with openings 102 over the high-voltage PMOS(P-channel FETs), labeled HVP, is used to implant the source/drain (S/D) contacts as depicted by I/I(13). The implanted dopant is B$^{11}$ and the substrate is preferably doped to a concentration of between about 0.8 E 19 and 1.5 E 19 atoms/cm$^3$. The photoresist 100 is then removed.

Figure 22:
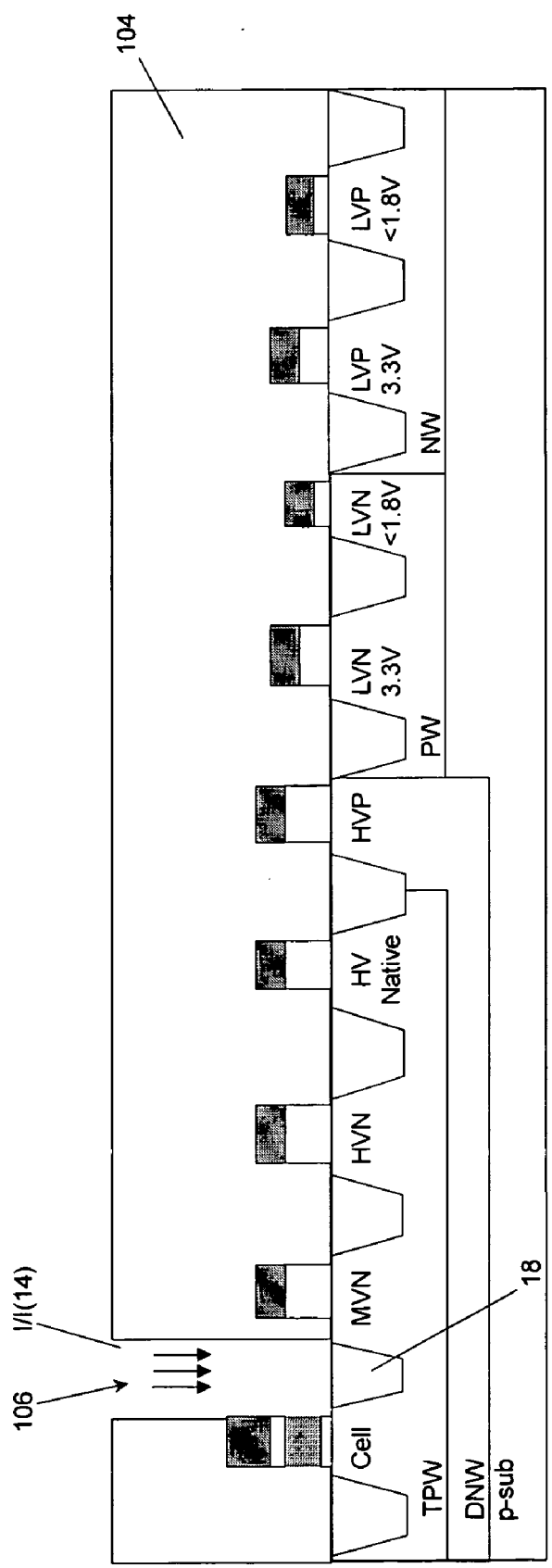

Referring to FIG. 22, a self-aligned source mask 104 (photoresist) is formed with openings 106 self-aligned over the source region of the flash memory cell (floating-gate transistor). The trench oxide 18 and portions of the substrate 10 are etched in the openings adjacent to the EEPROM. The cell source is then implanted, labeled I/I(14), with an N type dopant, such as arsenic or phosphorus, to have a final concentration of between about 4.0 E 19 and 5.0 E 19 atoms/cm$^3$ after annealing, and is formed to a depth of about 1000 to 2500 Angstroms. The photoresist 104 is removed.

Figure 23:
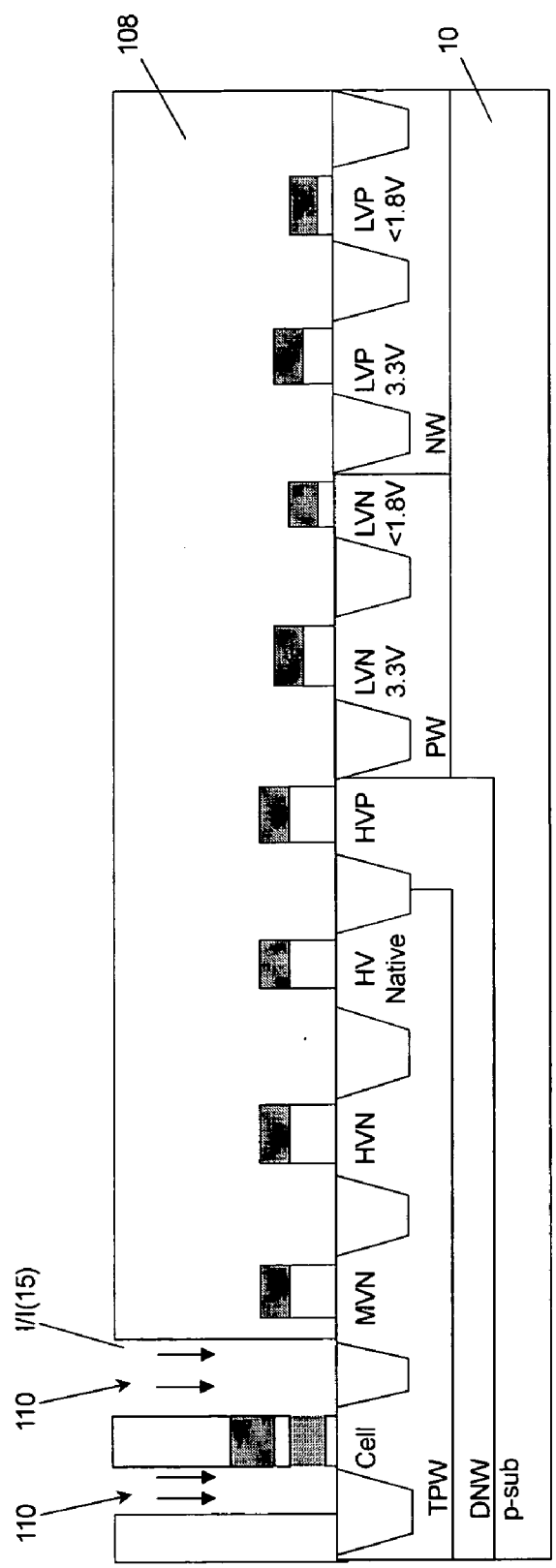

Referring to FIG. 23, a photoresist mask 108 is deposited with openings 110 aligned over the source/drain areas of the flash memory. The source/drain areas of the flash cell array are then implanted, labeled I/I(15), to form the source/drain areas for the cells. For NOR cells, the source/drain areas are implanted with an N type dopant, such as arsenic or phosphorus, to have a final concentration of between about 3.0 E 19 and 6.0 E 19 atoms/cm$^3$ after annealing, and are doped to a depth of about 3000 to 6000 Angstroms. For NAND and EEPROM cells, the source/drain areas are implanted with an N type dopant, preferably arsenic, to have a final concentration of between about 1.0 E 19 and 4.0 E 19 atoms/cm$^3$ after annealing, and are doped to a depth of about 1000 to 3000 Angstroms. The photoresist 108 is removed.

Figure 24:
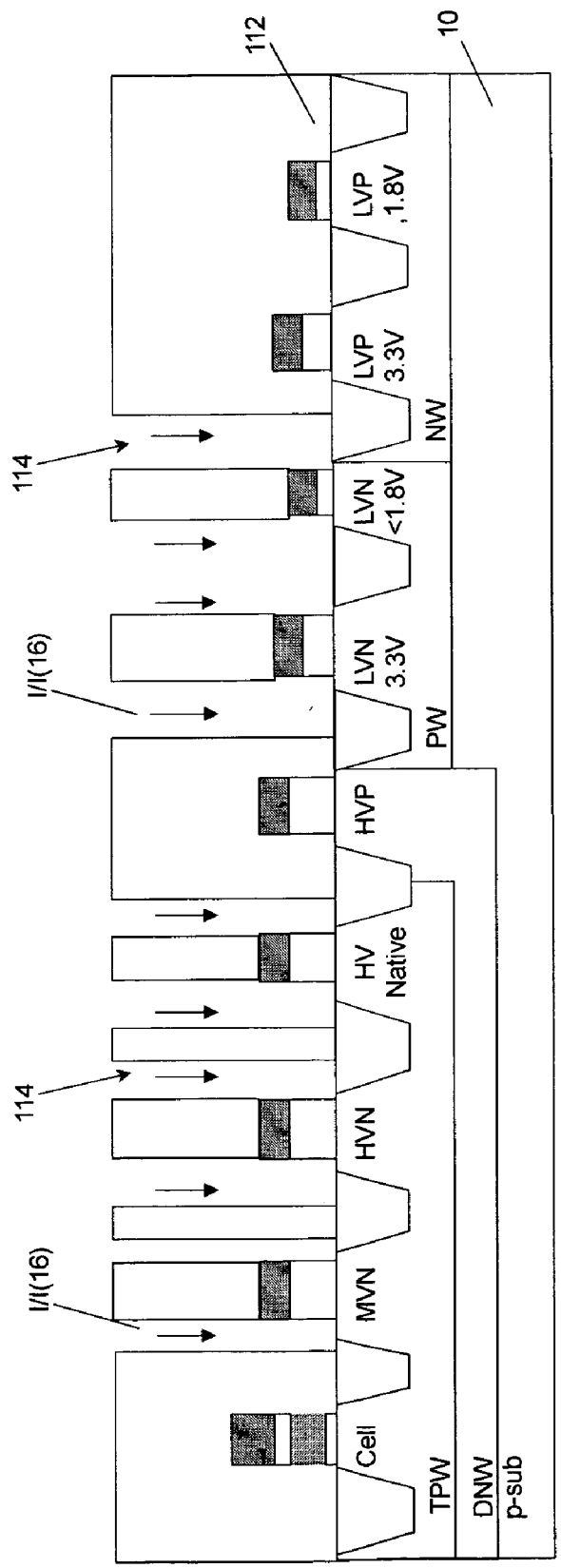

Referring to FIG. 24, a photoresist mask 112 is deposited with openings 114 aligned over the source/drain areas of the NMOS device. The source/drain areas of the NMOS are then implanted, labeled I/I(16), to form heavily doped (N+) source/drain areas for the peripheral NMOS, MVN NMOS and the pull-off source/drain implant for high-voltage NMOS. The source/drain contacts are implanted with an N type dopant, such as arsenic, to have a final concentration of between about 3.0 E 19 and 5.0 E 19 atoms/cm$^3$ after annealing, and are doped to a depth of about 1000 to 3000 Angstroms. The photoresist 112 is removed.

Figure 25:
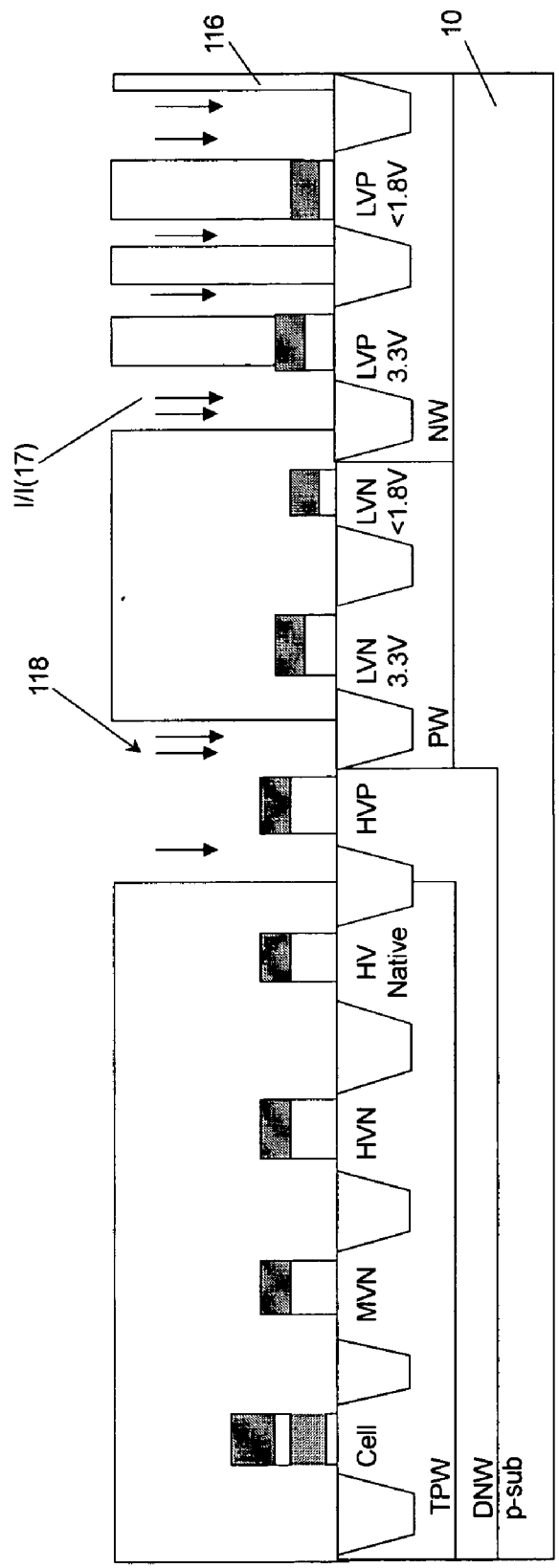

Referring to FIG. 25, a photoresist mask 116 is deposited with openings 118 aligned over the source/drain areas of the PMOS devices. The source/drain areas of the PMOS are then implanted, labeled I/I(17), to form heavily doped (P+) source/drain areas for the peripheral PMOS and the pull-off source/drain implant for high-voltage PMOS. The source/drain areas are implanted with a P type dopant, such as boron, to have a final concentration of between about 3.0 E 19 and 5.0 E 19 atoms/cm$^3$ after annealing, and are doped to a depth of about 1500 to 3000 Angstroms. The photoresist 116 is removed.

Figure 26:
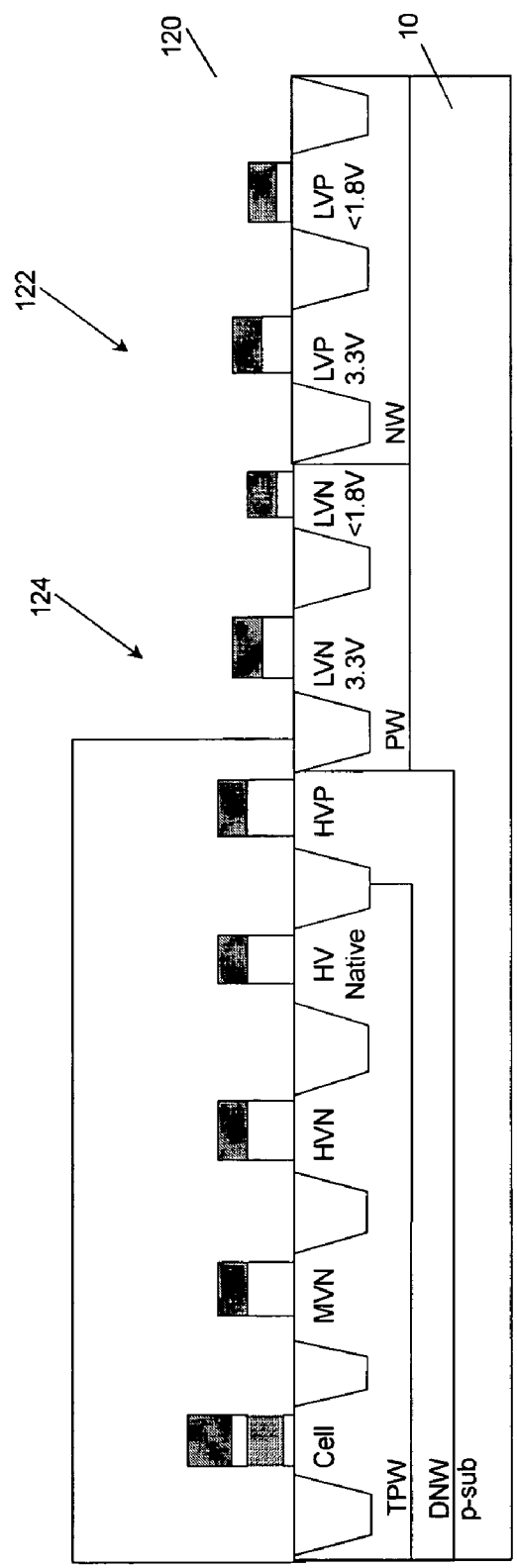

Referring to FIG. 26, a photoresist block-out mask 120 is used to selectively form a silicide on devices that require low-resistance polysilicon. The block-out mask 120 protects the high-voltage and the ESD, PMOS and NMOS devices, and has openings 122 over the NMOS and PMOS devices for metal deposition. Next a metal layer 124 is deposited and the photoresist 120 is removed. Metal layer 124 is preferably cobalt, deposited to a thickness of between about 500 and 1500 Angstroms, and is annealed to form a cobalt silicide.

Figure 27:
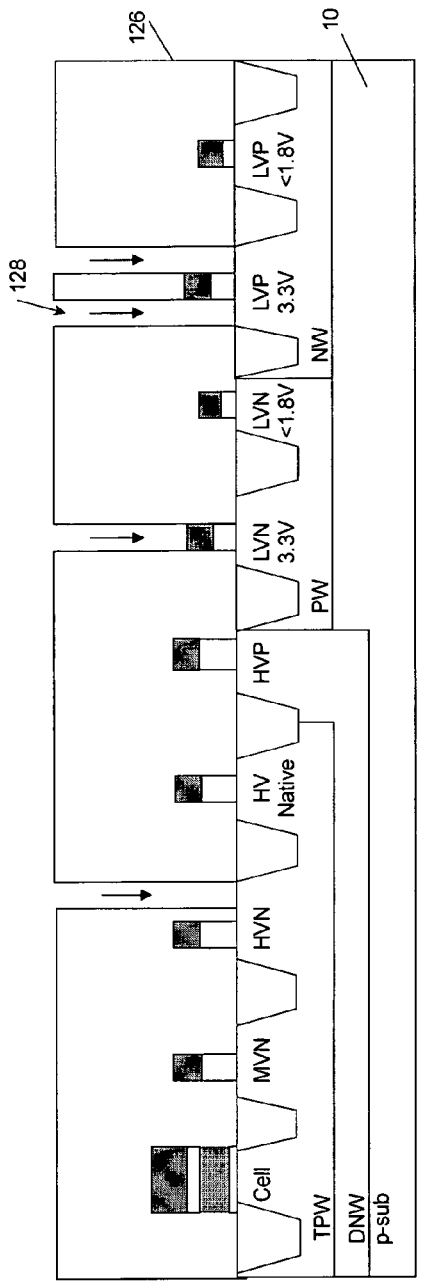

Referring to FIG. 27, a thin barrier layer (not shown) of silicon nitride is deposited on the substrate 10. A thick PSG or BPSG layer 126 is deposited by CVD using TEOS and is planarized to have a final thickness of between about 7000 and 9000 Angstroms over the substrate to form an insulating glass layer. A photoresist mask (not shown) and anisotropic plasma etching are used to etch contact openings 128 in layer 126 and the silicon nitride barrier layer (not shown) to the silicon substrate 10 and also to the second polysilicon layer 76 for metal contacts.

Figure 28:
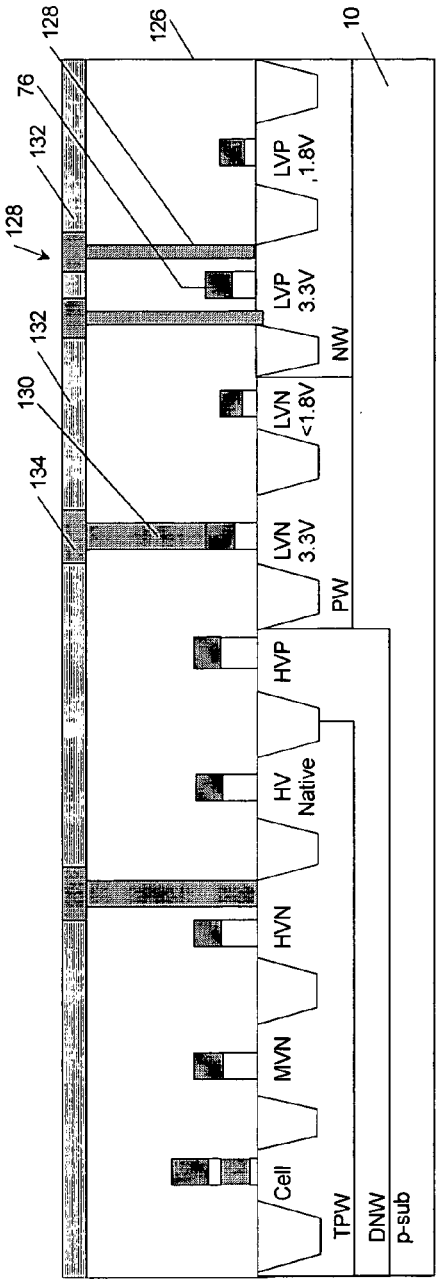
Figure 30:
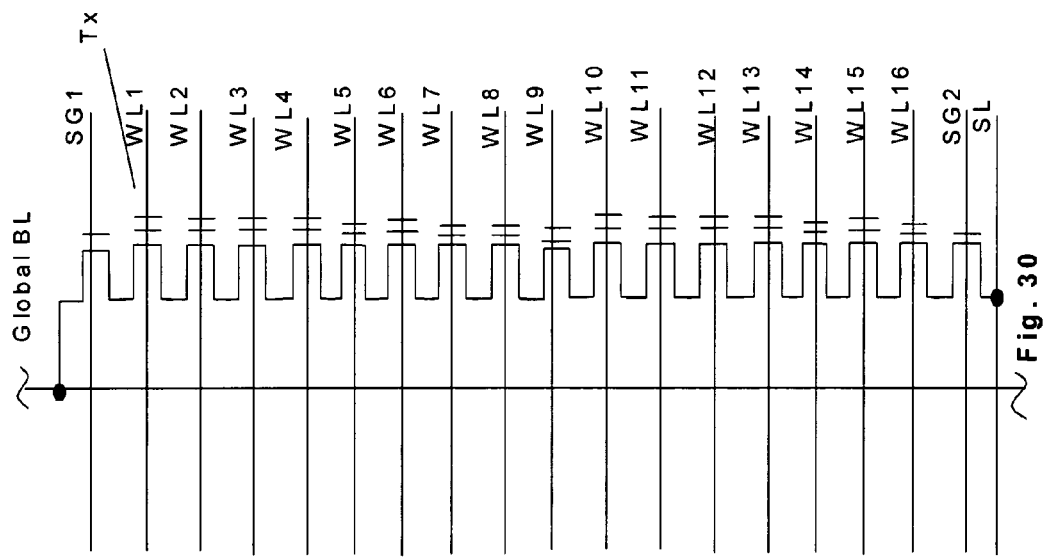
FIG. 30 shows a portion of a schematic circuit for a NAND-type flash memory.
Figure 29:
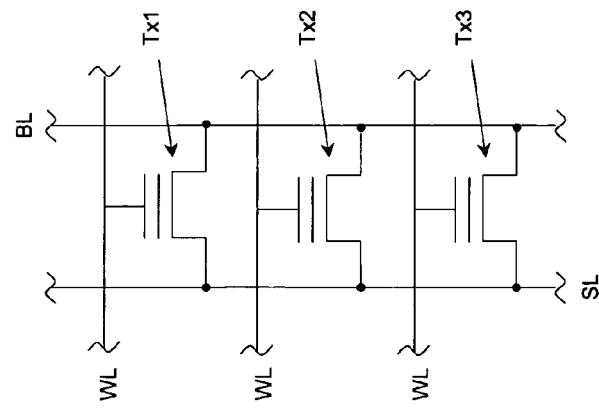
FIG. 29 shows a portion of a schematic circuit for a NOR-type flash memory.
Figure 31:
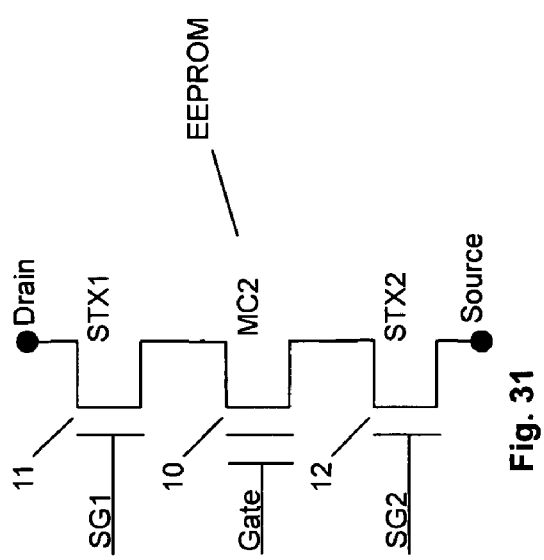
FIG. 31 shows a portion of a schematic circuit for a 3-transistor EEPROM.

Referring to FIG. 28, an N+ ion implant (for example arsenic) is performed in the exposed substrate and in the exposed polysilicon 76 in the openings 128. Then a thin conformal barrier layer (not shown) of titanium/titanium nitride is deposited to a thickness of about 1000 to 1500 Angstroms. After a rapid thermal anneal, a tungsten layer 130 is deposited and polished back to form tungsten plugs 130 in the openings 128. The tungsten 130 is polished back to glass layer 126 (single Damascene process).

Still referring to FIG. 28, a fluorosilicate glass (FSG) layer 132 is deposited. Layer 132 is deposited by CVD to a thickness of between about 9000 and 12,000 Angstroms. Recesses are etched in layer 132 using a photoresist mask (not shown) for the first level metal lines M1. Next a metal layer 134, such as Al, Cu, or the like, is deposited and polished back to form the first level of metal interconnections. This completes the unified integrated flash memory structure (consisting of NOR, NAND, and 3-transistor EEPROM) up to the first level of metal. Conventional processing can be used to complete the structure to form multiple levels of metal interconnections.

Although the cell areas are not described in detail, another key feature of this invention is to use a first implant step to optimize the threshold voltage (Vt) for the 3-transistor EEPROM arrays and for the NAND flash memory arrays, and to use a separate second implant step to dope areas to optimize the threshold voltage (Vt) for the NOR flash memory arrays. This allows the NOR flash memory arrays to be optimized for the channel hot electron (CHE) programming while providing Fowler-Nordheim (FN) programming (tunneling) for the NAND flash memory arrays and the 3-transistor EEPROM arrays.

While the invention has been particularly shown and described with reference to the preferred embodiments thereof, it will be understood by those skilled in the art that various changes in form and details may be made without departing from the spirit and scope of the invention.

What is claimed is:

1. A non-volatile memory structure on and in a semiconductor P-substrate comprised of:
    deep N doped wells in said P-substrate;
    triple-P doped wells in said deep N doped wells;
    N-channel floating-gate transistors formed on said P-substrate or on said triple-P doped wells for NOR and NAND flash memory arrays and for 3-transistor EEPROM arrays or any combination of these three memories;
    peripheral devices of high-voltage NMOS FETs in said triple-P doped wells and of high-voltage PMOS FETs in said deep N wells.

2. The non-volatile memory structure of claim 1, wherein said semiconductor substrate is a P doped single-crystal silicon wafer doped with boron to a concentration of between about 5.0 E 14 and 9.0 E 14 atoms/cm$^3$.

3. The non-volatile memory structure of claim 1, wherein one or more of said floating-gate transistors are formed between select line (SL) transistors to form byte word lines, said NOR flash memory arrays, said NAND flash memory arrays, and said EEPROM memory arrays.

4. The non-volatile memory structure of claim 1, wherein formation of said floating-gate transistors in said triple-P doped wells or said P-substrate results in a single negative erase voltage on the control gates of said floating-gate transistors and a single positive program voltage on control gates for said NOR and said NAND flash memory arrays and said EEPROM memory arrays.

5. The non-volatile memory structure of claim 4, wherein said negative erase voltage is between about −18 and −20 volts, and said positive program voltage is between about +18 and +20 volts.

6. The non-volatile memory structure of claim 1, wherein said deep N doped wells are formed to a depth of between 25,000 and 35,000 Angstroms, and are doped with phosphorus to a concentration of between 5.0 E 15 and 1.0 E 16 atoms/cm$^3$.

7. The non-volatile memory structure of claim 1, wherein said triple-P doped wells are formed to a depth of between 10,000 and 20,000 Angstroms, and are doped with boron to a concentration of between 1.0 E 16 and 2.0 E 16 atoms/cm$^3$.

8. The non-volatile memory structure of claim 1, wherein said triple-P doped wells or said P-substrate have floating gate oxides formed to a thickness of between about 70 and 90 Angstroms, and polysilicon floating gates on said floating gate oxides for said floating-gate transistors.

9. The non-volatile memory structure of claim 8, wherein top surface of said polysilicon floating gates have a control gate oxide comprised of a multilayer of a silicon oxide layer having a thickness of between about 35 and 50 Angstroms, a silicon nitride layer having a thickness of between about 100 and 200 Angstroms, and a silicon oxide layer having a thickness of between about 35 and 50 Angstroms, and further polysilicon control gates having a thickness of between about 1800 and 3000 Angstroms formed on said control gate oxide.

10. A method for making a non-volatile memory on and in a semiconductor P-substrate comprising the steps of:
    forming deep N doped wells in said P-substrate;
    forming triple-P doped wells in said deep N doped wells;
    forming N-channel floating-gate transistors in and on said P-substrate or said triple-P doped wells for NOR and NAND flash memory arrays and for 3-transistor EEPROM arrays;
    forming peripheral devices of high-voltage NMOS FETs in said triple-P doped wells and of high-voltage PMOS FETs in said deep N wells.

11. The method of claim 10, wherein said semiconductor P-substrate is a P doped single-crystal silicon wafer doped with boron to a concentration of between about 5.0 E 14 and 9.0 E 14 atoms/cm$^3$.

12. The method of claim 10, wherein one or more of said floating-gate transistors are formed between select line (SL) transistors to form byte word lines, said NOR memory arrays, and said NAND memory arrays.

13. The method of claim 10, wherein said floating-gate transistors formed in said triple-P doped wells result in a single negative erase voltage on the control gates of said floating-gate transistors and a single positive program voltage on control gates for said NOR and said NAND flash memory arrays.

14. The method of claim 13, wherein said negative erase voltage is between about −18 and −20 volts, and said positive program voltage is between about +18 and +20 volts.

15. The method of claim 10, wherein said deep N doped wells are formed to a depth of between 25,000 and 35,000 Angstroms, and are doped with phosphorus to a concentration of between 5.0 E 15 and 1.0 E 16 atoms/cm$^3$.

16. The method of claim 10, wherein said triple-P doped wells are formed to a depth of between 10,000 and 20,000 Angstroms, and are doped with boron to a concentration of between 1.0 E 16 and 2.0 E 16 atoms/cm$^3$.

17. The method of claim 10, wherein said triple-P doped wells or said P-substrate have floating gate oxides formed to a thickness of between about 70 and 90 Angstroms, and polysilicon floating gates are formed to a thickness of between about 1200 and 2000 Angstroms on said floating gate oxides for said floating-gate transistors.

18. The method of claim 17, wherein top surface of said polysilicon floating gates have a control gate oxide by forming a multilayer of a silicon oxide layer having a thickness of between about 35 and 50 Angstroms, a silicon nitride layer having a thickness of between about 100 and 200 Angstroms, and a silicon oxide layer having a thickness of between about 35 and 50 Angstroms.

19. The non-volatile memory structure of claim 1, wherein said structure is used to make subscriber identity modules (SIMs), smart cards, and e-passports.

20. The non-volatile memory structure of claim 1, wherein said structure is used to make JAVA cards and national ID cards.

21. The method of claim 10, wherein areas on said P-substrate or in said triple-P doped wells are doped during a first implant step to optimize the threshold voltage for said 3-transistor EEPROM arrays and said NAND flash memory arrays, and using a separate second implant step areas are doped to optimize the threshold voltage for said NOR flash memory arrays.

* * * * *